(12) United States Patent
Nearman et al.

(10) Patent No.: US 8,136,279 B1
(45) Date of Patent: Mar. 20, 2012

(54) ELECTRONIC SIGN MODULE HOUSING HAVING AN OVERMOLDED GASKET SEAL

(75) Inventors: Nathan L. Nearman, Brookings, SD (US); Kory D. Kludt, Sioux Falls, SD (US)

(73) Assignee: Daktronics, Inc., Brookings, SD (US)

( * ) Notice: Subject to any disclaimer, the term of this patent is extended or adjusted under 35 U.S.C. 154(b) by 500 days.

(21) Appl. No.: 12/220,825

(22) Filed: Jul. 29, 2008

Related U.S. Application Data

(60) Provisional application No. 60/962,732, filed on Jul. 31, 2007.

(51) Int. Cl.
*G09F 13/04* (2006.01)
*A47G 1/06* (2006.01)
*F16L 17/06* (2006.01)
*H02G 15/04* (2006.01)
*F16J 15/02* (2006.01)

(52) U.S. Cl. ............. 40/564; 40/578; 40/718; 277/609; 277/617; 277/630; 277/637; 277/644; 277/641; 277/648; 277/649

(58) Field of Classification Search .................... 40/564, 40/578, 718; 277/641, 642, 609, 617, 630, 277/637, 644, 648, 649
See application file for complete search history.

(56) References Cited

U.S. PATENT DOCUMENTS

| | | | |
|---|---|---|---|
| 2,053,547 A | 9/1936 | Austin | |
| 3,403,717 A * | 10/1968 | Lemelson | ..................... 411/143 |
| 3,594,761 A | 7/1971 | Boesen | |
| 4,234,914 A | 11/1980 | Boesen | |
| 5,172,504 A | 12/1992 | De Maat et al. | |
| 5,268,828 A | 12/1993 | Miura | |
| 5,647,152 A | 7/1997 | Miura | |
| 5,692,855 A | 12/1997 | Burton | |
| 5,715,619 A | 2/1998 | Polisois et al. | |
| 6,154,945 A | 12/2000 | Voelzke | |
| 6,314,669 B1 | 11/2001 | Tucker | |
| 6,508,494 B1 | 1/2003 | Reuter et al. | |
| 6,729,054 B1 | 5/2004 | VanderTuin | |
| 6,832,444 B1 * | 12/2004 | MacNeil | ........................ 40/209 |
| 7,055,271 B2 | 6/2006 | Lutz et al. | |
| 2003/0217495 A1 | 11/2003 | Nagamine et al. | |
| 2005/0152139 A1 * | 7/2005 | Loving et al. | ................. 362/227 |

OTHER PUBLICATIONS

"U.S. Appl. No. 10/688,304, Amendment and Response filed Feb. 28, 2005 to Office Action mailed Feb. 18, 2005", 15 pgs.
"U.S. Appl. No. 10/688,304, Amendment and Response filed Oct. 14, 2005 to Office Action mailed Jul. 14, 2005", 14 pgs.
"U.S. Appl. No. 10/688,304, Non-Final Office Action mailed Jul. 14, 2005", 5 pgs.

(Continued)

*Primary Examiner* — Joanne Silbermann
*Assistant Examiner* — Syed A Islam
(74) *Attorney, Agent, or Firm* — Schwegman, Lundberg & Woessner P.A.

(57) ABSTRACT

An electronic sign module housing having an overmolded gasket seal including an elastomer overmolded gasket seal with an inner and an outer lip and a base overmolded to a rearwardly located contact surface of an electronic sign module housing. Grooves on the contact surface of the electronic sign module housing provide additional bonding surfaces with a greater surface area to enhance the chemically-bonded overmolding of the overmolded gasket seal. Truncated conical projections extending forwardly from the elastomer base extend into correspondingly shaped truncated conical cavities in the electronic sign module housing in order to provide additional chemical bonding and to provide a geometrically based frictional engagement arrangement.

26 Claims, 8 Drawing Sheets

OTHER PUBLICATIONS

"U.S. Appl. No. 10/688,304, Notice of Allowance mailed Jan. 17, 2006", 4 pgs.

"U.S. Appl. No. 10/688,304, Restriction Requirement mailed Feb. 18, 2005", 5 pgs.

* cited by examiner

ELECTRONIC SIGN MODULE HOUSING HAVING AN OVERMOLDED GASKET SEAL

CROSS REFERENCES TO RELATED APPLICATIONS

This patent application is related to patent application Ser. No. 10/688,304 filed on Oct. 17, 2003, entitled "Electronic Display Module Having a Four-point Latching System for Incorporation into an Electronic Sign and Process", now U.S. Pat. No. 7,055,271 which is hereby incorporated into this application by reference as if fully set forth herein.

This application claims priority from the earlier filed U.S. Provisional Application No. 60/962,732 filed Jul. 31, 2007, entitled "Electronic Sign Module Housing. Having an Overmolded Gasket Seal", and is hereby incorporated into this application by reference as if fully set forth herein.

BACKGROUND OF THE INVENTION

1. Field of the Invention

The present invention relates to the structure of an electronic sign, and more particularly, for an electronic sign module housing having an overmolded gasket seal.

2. Description of the Prior Art

Electronic signs incorporate sophisticated electronic components and pluralities of illumination devices, such as, but not limited to, light emitting diodes (LEDs). Operation of electronic signs using such associated devices and/or other devices is often under harsh or otherwise unsuitable environmental conditions involving, heat, cold, dust, wind, rain, snow, and the like, whereby proper sealing of the electronic sign is beneficial to the long term use and proper and efficient operation of the electronic sign. Generally, a seal was provided between a housing of an electronic sign display module and a mounting panel having one or more accommodating features. One prior art method of incorporation of a sealing gasket on an LED display module was the manual placement and manual alignment of a gasket onto the display module often followed by the manual application of an adhesive. The manual placement and application of an adhesive were time-consuming and sometimes inaccurate because of inherent human error.

Yet, another method of applying a gasket is one that uses a two-part mix or "foam in place" gasket where the two parts are mixed and put into a trough or moat in the housing. The parts then react and create a foam gasket. The disadvantage of the "foam in place" gasket is its inconsistency in the durometer and variability in the gasket height. The combination of these two inconsistencies creates significant module registration difficulties where the faces of the modules do not necessarily lie in the same place even though a seal has been made. Variations in the temperature can also cause problems where the seals or gaskets which are fixed to one or more surfaces with an adhesive encounter difficulty maintaining a suitable seal if the adhesive deteriorates due to various expansion rates.

The present invention solves the shortcomings of prior art sealing methods and the problem of having inaccurate and imprecise gaskets for the exclusion of water and debris seal protection by providing a multifaceted seal which is overmolded to multiple surfaces of an electronic sign module housing. The overmolded gasket, in combination with the electronic sign module housing, is formed and used to mate with a mounting panel, whereby access by water or dust or other objects exterior to the mounting panel and through the rear of the electronic sign module housing to the interior of the sign using the present invention is totally prevented and whereby the electronic sign is protected against low pressure jets of water from all directions with limited ingress as permitted according to IP-65 ratings.

SUMMARY OF THE INVENTION

The general purpose of the present invention is to provide an electronic sign module housing having an overmolded gasket seal.

According to one or more embodiments of the present invention, there is provide a gasket seal, in the form of an overmold having flexible double lips, which is overmolded with a housing used in the construction of an electronic sign module. Fastening of the overmolded gasket seal to the electronic sign module housing is provided by several methods including chemical bonding and geometrical fixation. The electronic sign module housing includes a configured geometry in the form of multiple grooves to provide extra surface area for mutual overmolded bonding with the overmolded gasket seal. The electronic sign module housing also includes truncated conical cavities within which some of the overmolded gasket seal material in the form of truncated conical projections are anchored.

One significant aspect and feature of the present invention is the use of chemical bonding and geometric configurations to secure an overmolded gasket seal to an electronic sign module housing.

Another significant aspect and feature of the present invention is the use of an overmold process (chemical bonding) to install a gasket seal directly on an electronic sign module housing.

Another significant aspect and feature of the present invention is the use of grooves on an electronic sign module housing to provide more surface area for the overmolded gasket seal material to bond to.

Still another significant aspect and feature of the present invention is the use of truncated conical cavities for anchoring of the overmolded gasket seal to the electronic sign module housing.

Still another significant aspect and feature of the present invention is the use of double lips for sealing against a mounting panel.

Still another significant aspect and feature of the present invention is the removal of human error in applying the overmolded gasket seal to the electronic sign module housing.

Still another significant aspect and feature of the present invention is that the overmolded gasket seal has a longer expected life compared to a short lived adhesive.

Still another significant aspect and feature of the present invention is the precision and accuracy with which the gasket can be produced, thus minimizing module registration.

Still another significant aspect and feature of the present invention is the durability and ruggedness of the overmolded gasket seal.

Having thus briefly described one or more embodiments of the present invention, and having mentioned some significant aspects and features of the present invention, it is the principal object of the present invention to provide an electronic sign module housing having an overmolded gasket seal.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
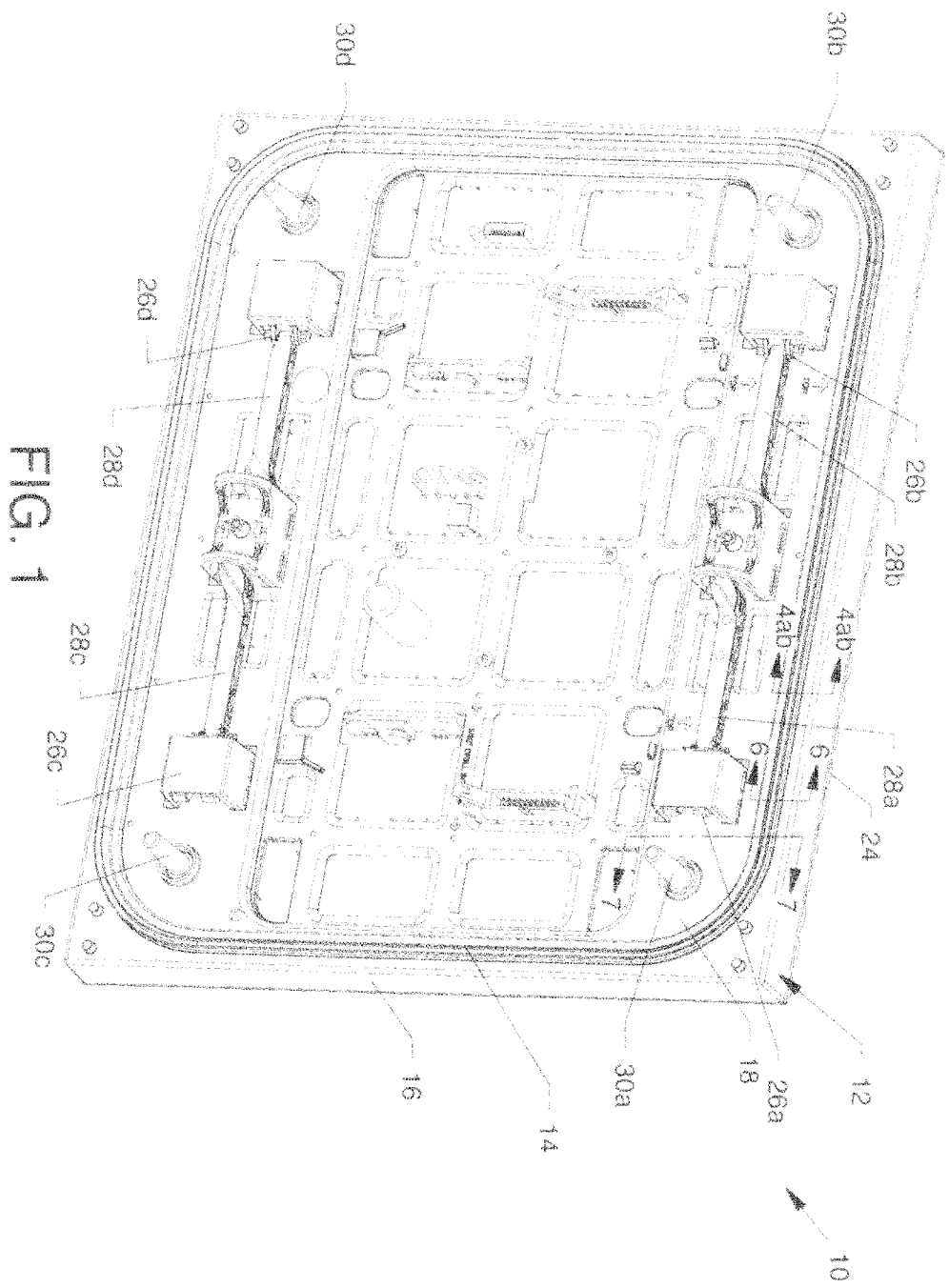
FIG. 1 is a rear isometric view of an electronic sign module housing having an overmolded gasket seal, the present invention.

FIG. 1 is a rear isometric view of a an electronic sign module housing having an overmolded gasket seal 10, the present invention, including an electronic sign module housing 12 and an overmolded gasket seal 14 attached thereto. The housing 12 of the present invention is closely related to and is constructed according to the teachings and principals of the housing and can be incorporated into use with other components and features of the previously referenced U.S. Pat. No. 7,055,271 entitled "Electronic Display Module Having a Four-point Latching System for Incorporation into an Electronic Sign and Process". For a brief reference and for familiarization, some of the visible common closely associated components of the present invention, which are also included in U.S. Pat. No. 7,055,271, include a peripheral wall 16, a configured panel 18, a louver panel 24 at the front of the electronic sign module housing 12, actuator arms 28a-28d, and locator posts 30a-30d. The overmolded gasket seal 14 in combination with the geometrically configured features of the panel 18 adds functionality to the electronic sign module housing 12 by providing a fixed-in-place overmolded gasket seal 14 which requires minimum alignment skills of an assembler when the electronic sign module housing 12, including the overmolded gasket seal 14, is mated with the front panel of an electronic sign enclosure.

Figure 2:
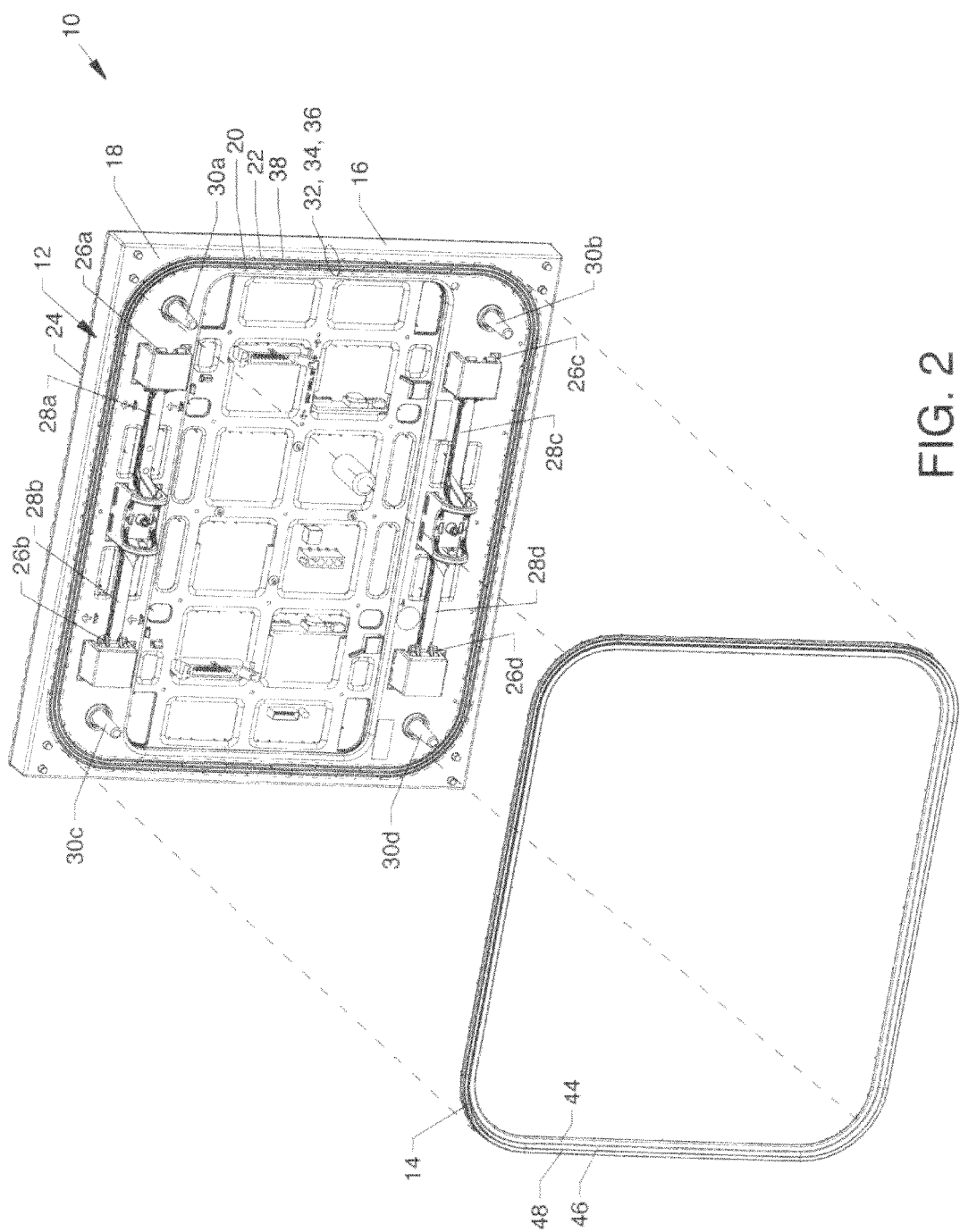
FIG. 2 is a semi-exploded rear isometric view of the electronic sign module housing having an overmolded gasket seal showing the overmolded gasket seal spaced from a panel of the electronic sign module housing.
Figure 3:
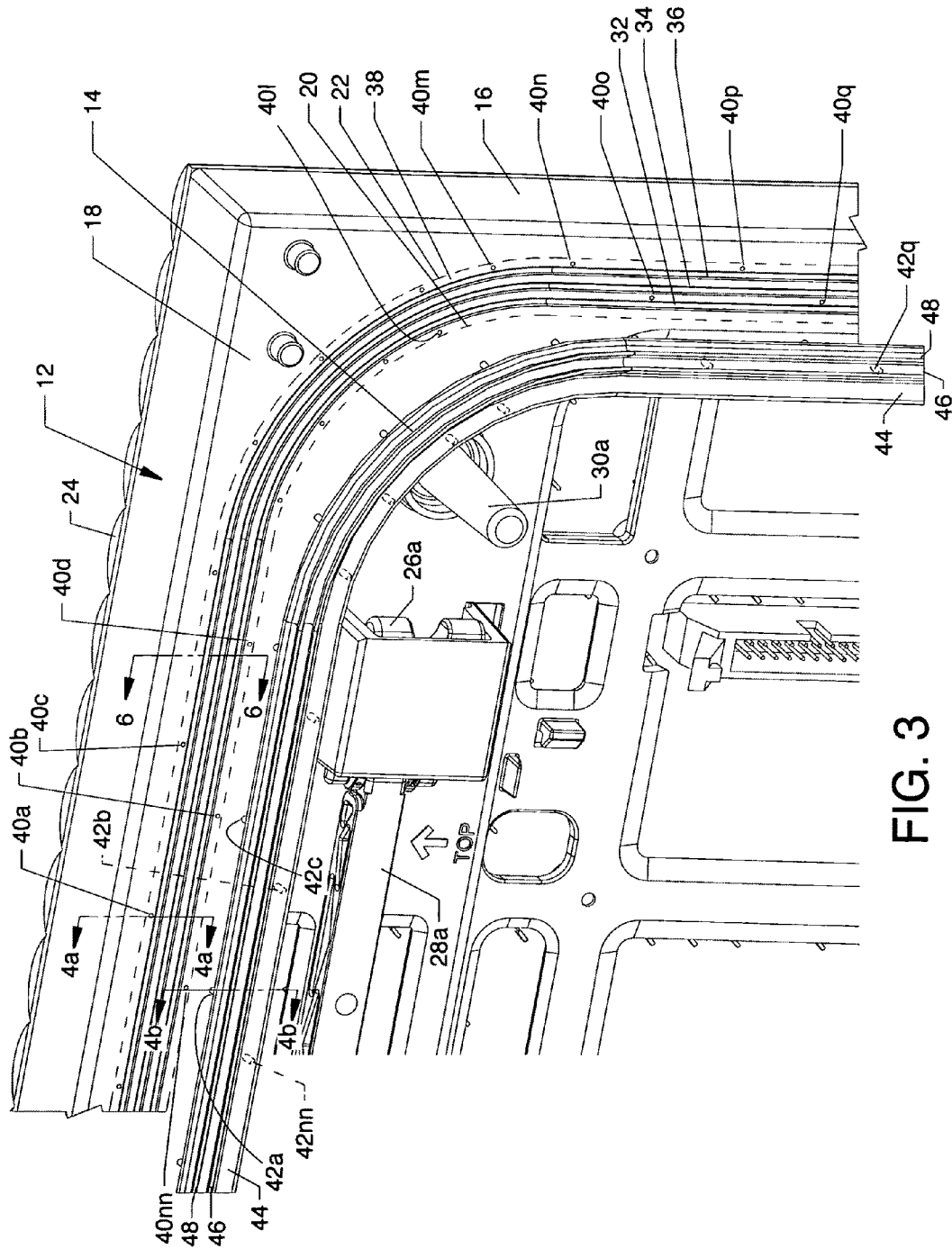
FIG. 3 is an exploded view of an upper corner of the present invention where the overmolded gasket seal, such as formed by overmolding, is shown spaced from the electronic sign module housing.

FIG. 2 is a semi-exploded rear isometric view of the electronic sign module housing having an overmolded gasket seal 10 showing the overmolded gasket seal 14 distanced from the panel 18 of the electronic sign module housing 12. FIG. 3 is an exploded view of a section of an upper corner of the electronic sign module housing 12 and a section of the overmolded gasket seal 14 spaced therefrom.

Distancing of the overmolded gasket seal 14 from the electronic sign module housing 12 reveals a plurality of continuously spaced concentrically arranged inner, middle and outer elongated arcuate grooves 32, 34 and 36, the paths of which generally are in the shape of rectangles having rounded corners. The inner, middle and outer arcuate grooves 32, 34 and 36 extend through and below the rear planar surface of and a short distance into the panel 18 and are located within an outline encompassing an interrupted contact surface 38 of the panel 18. The arcuate grooves are aligned with features of the overmolded gasket seal 14 and which arcuate grooves are shown and bounded by dashed lines 20 and 22 superimposed on the panel 18. A plurality of truncated conical cavities 40a-40n is located along and about and extend through the contact surface 38 and into the panel 18. The truncated conical cavities 40a-40n act in concert with the overmolding features to capture material comprising the overmolded gasket seal 14 in order to assist in anchoring it to the electronic sign module housing 12, as later described in detail. The truncated conical cavities 40a-40n are aligned in various locations along the contact surface 38 and extend through the panel 18 in order to provide a widely based and uniform distribution of the truncated conical cavities 40a-40n and to communicate with a plurality of truncated conical projections 42a-42nn which extend from the front side of the overmolded gasket seal 14 and which flow into the plurality of truncated conical cavities 40a-40n during the molding process. Other visible parts of the continuous overmolded gasket seal 14 include a continuous base 44 and a continuously spaced concentrically arranged parallel compliant flexible inner lip 46 and an outer lip 48, as further described in FIG. 4. The overmolded gasket seal 14 is formed of a flexible compliant material, such as, but not limited to, a thermoplastic elastomer (TPE) or other such material, such as described later in detail.

Figure 4:
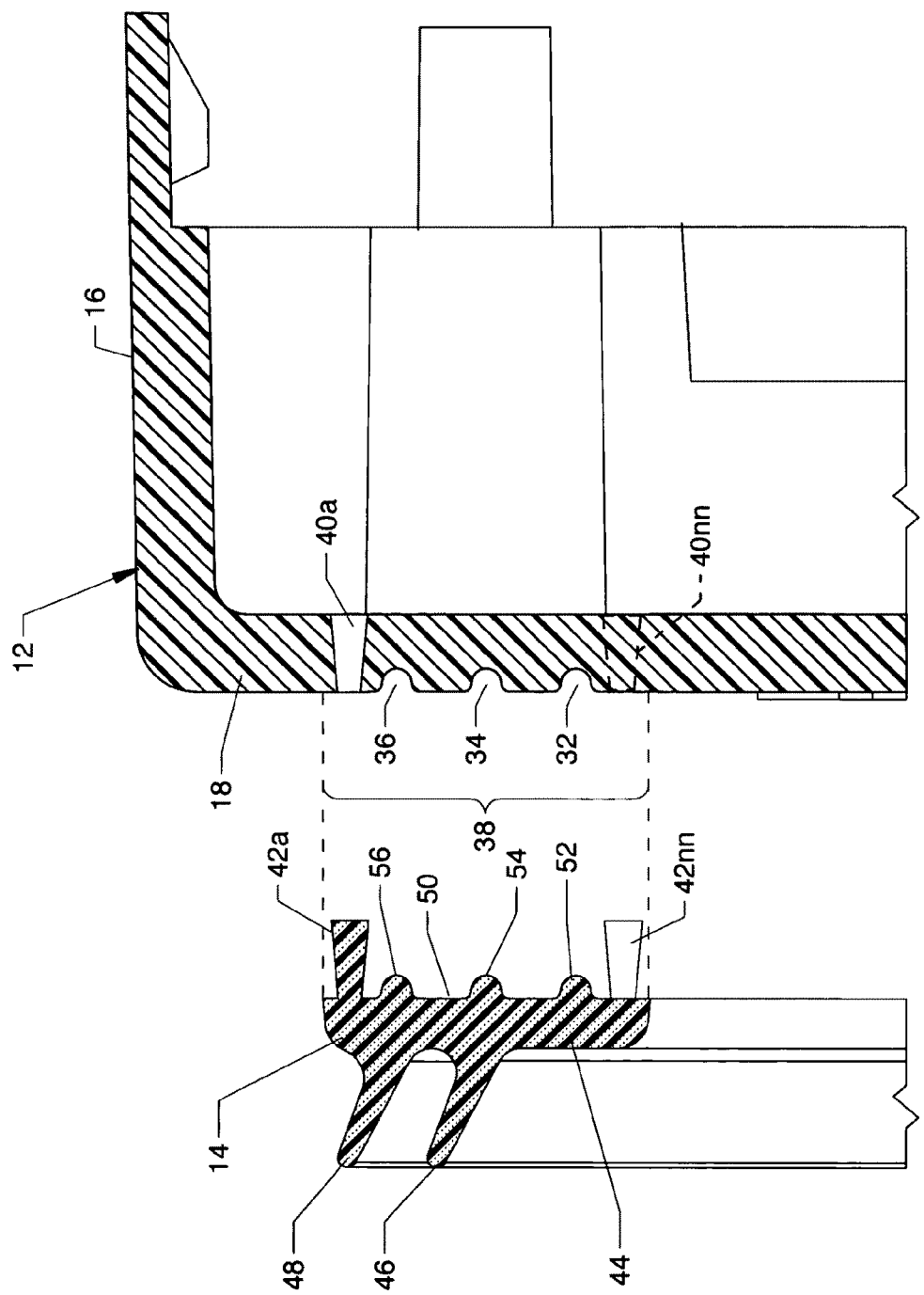
FIG. 4 is an exploded section view generally along section lines 4a-4a and lines 4b-4b of FIG. 1 shown in combined form as lines 4ab-4ab thereupon.

FIG. 4 is a section view generally along a combined section line 4ab-4ab of FIG. 1, but more specifically is shown in greater detail along corresponding section lines 4a-4a and 4b-4b of FIG. 3 where the overmolded gasket seal 14, such as formed by overmolding, is shown spaced from the electronic sign module housing 12. Features of the electronic sign module housing 12 and the overmolded gasket seal 14 are further described in detail. The arcuate grooves 32, 34 and 36 are shown extending through the contact surface 38 and into the panel 18 of the electronic sign module housing 12. The use of arcuate grooves of 180° or less is friendly to overmolding bonding. Other shapes or modification of the arcuate grooves can be used which are suitable for bonding and which can also enhance communication and frictional engagement between the overmolded gasket seal 14 and the electronic sign module housing 12. The arcuate structure for the inner, middle and outer arcuate grooves 32, 34 and 36 can exceed 180° by a suitable arcuate dimension in order to provide a physical frictional engagement of the injected gasket seal material, as well as providing a chemically bonded overmold engagement between the overmolded gasket seal 14 and the electronic sign module housing 12. Other geometrically configured groove-like structures could also be used including, but not limited to, a square groove, an inverted T-groove, a truncated triangular groove, or other suitable geometric shapes conducive to bonding, capturing or captured bonding and the like.

In addition to the use of a chemical bonding and/or a physical attachment between the overmolded gasket seal 14 and features thereof with the electronic sign module housing 12, the use of truncated conical cavities 40a-40n is also beneficial. The truncated conical cavities 40a-40n are tapered and accept inflow of molding material, thereby forming the truncated conical projections 42a-42nn extending from the overmold gasket seal 14 in order to provide a physical frictional attachment, as well as a chemically bonded overmold engagement with the truncated conical cavities 40a-40n and the truncated conical projections 42a-42nn between the overmolded gasket seal 14 and the electronic sign module housing 12.

The overmolded gasket seal 14 is shaped by in-place molding by methods known in the art to form and cause chemical bonding of material comprising the overmolded gasket seal 14 and the features thereof to the electronic sign module housing 12, as well as providing captured physical frictional engagement therebetween. During and subsequent to overmolding, the overmolded gasket seal 14 assumes the exterior mold shape and the immediate shape of the structure to which overmolding takes place, whereby a plurality of geometrically shaped features are resultantly formed, such as now described herein, as separate features for the sake of clarity and demonstration, i.e., the overmolded gasket seal 14 is described such as it would appear subsequent to overmolding and removed from intimate contact with the electronic sign module housing 12. The overmolded gasket seal 14 includes the flexible inner lip 46 and the flexible outer lip 48 each extending at an angle from the base 44 in order that flexing of the inner lip 46 and the outer lip 48 can conformingly provide a seal between the front panel of an electronic sign enclosure when engaged thereto under slight pressure. A planar surface 50 is located on the front side of the base 44 and is interrupted by the previously described plurality of truncated conical projections 42a-42n extending forwardly from the base 44. The planar surface 50 is also interrupted by a plurality of continuously spaced concentrically arranged inner, middle and outer elongated arcuate projections 52, 54 and 56, the paths of which generally are in the shape and form of rectangles having rounded corners extending forwardly from the base 44. Other geometrically configured shapes, such as, but not limited to, those which would be conformingly and correspondingly accommodated by the alternative shapes of previously described geometrically configured groove-like structures for the inner, middle and outer arcuate grooves 32, 34 and 36 can also be used in lieu of the inner, middle and outer elongated arcuate projections 52, 54 and 56.

Figure 5:
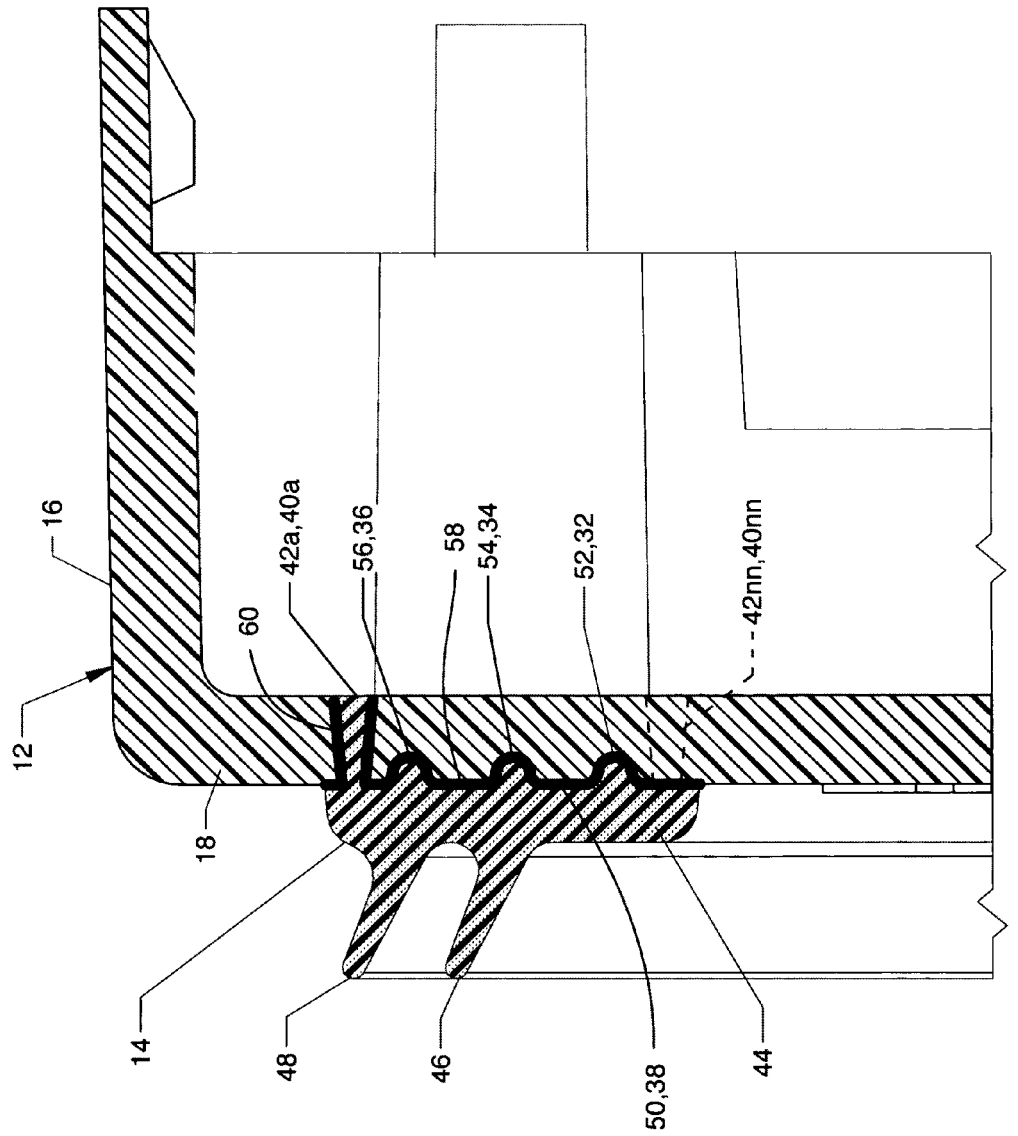
FIG. 5 is an assembled view of the components of FIG. 4 where the overmolded gasket seal is bonded to the electronic sign module housing.

FIG. 5 is similar to FIG. 4 where the overmolded gasket seal 14 is bonded to the electronic sign module housing 12 by an overmolding process. With respect to the overmolded gasket seal 14, the cross section extends through the base 44, through the inner lip 46 and outer lip 48, through the planar surface 50, through the inner, middle and outer elongated arcuate projections 52, 54 and 56, and through the truncated conical projection 42a of the overmolded gasket seal 14. With respect to the electronic sign molded housing 12, the cross section also extends through the peripheral wall 16, the panel 18, the truncated conical cavity 40a, the inner, middle and outer arcuate grooves 32, 34 and 36, and the contact surface 38 of the electronic sign module housing 12. Overmolding is the process where two parts, a substrate and an overmold, are joined together to make a final product. In the present invention, the substrate is the electronic sign module housing 12 which is made in a first injection mold tool and which consists of hard and rigid plastic. The electronic sign module housing 12 is removed from the first injection mold tool and then placed in a second mold, i.e., an overmold tool, where a thermoplastic elastomer (TPE) material, such as Versaflex® by GLS Corporation of McHenry, Ill., or other suitable material, such as, but not limited to, Tekbond® by Teknor Apex Company of Pawtucket, R.I., is applied by injection molding to form the overmolded gasket seal 14 which forms a chemical bond with the electronic sign module housing 12. The overmold tool is tooled to precisely fit the electronic sign module housing 12 in it, i.e., the substrate, and allow for application of TPE overmold material, i.e., the overmold therein and thereupon. The overmold and the substrate, i.e., the thermoplastic elastomer of the overmolded gasket seal 14 and the plastic material of the electronic sign module housing 12, form a continuous chemical bond 58 where the combined surface 50 of the overmolded gasket seal 14 which is uninterrupted by the inner, middle and outer arcuate projections 52, 54 and 56 and the inner, middle and outer arcuate projections 52, 54 and 56 and which interrupt the surface 50 comprise a portion of the continuous chemical bond 58 and the combined contact surface 38 of the electronic sign module housing 12 which is uninterrupted by the inner, middle and outer arcuate grooves 32, 34 and 36 and the inner, middle and outer arcuate grooves 32, 34 and 36 and which interrupt the contact surface 38 comprise another portion of a continuous chemical bond 58. The use of and relationship of the inner, middle and outer arcuate grooves 32, 34 and 36 is such that an additional bonding surface is provided extending through the contact surface 38 and into the panel 18 by the inner, middle and outer arcuate grooves 32, 34 and 36 of the substrate electronic sign module housing 12 and which grooves correspondingly interface with the inner, middle and outer arcuate projections 52, 54 and 56 and the planar surface 50 of the overmolded gasket seal 14. Alone, the chemical bond 58 along the contact surface 38, the inner, middle and outer arcuate grooves 32, 34 and 36, the planar surface 50 and the inner, middle and outer arcuate projections 52, 54 and 56 provides for a suitable attachment of the overmolded gasket seal 14 to the electronic sign module housing 12 by the merits of the chemical bond 58. Additionally, protection against a shearing force is provided by the geometric physical shapes of the inner, middle and outer arcuate projections 52, 54 and 56 of the overmolded gasket seal 14 extending into the inner, middle and outer arcuate grooves 32, 34 and 36 of the electronic sign module housing 12. For example, if a sidewards force was applied to the overmolded gasket seal 14, the physical geometric relationship of the inner, middle and outer arcuate projections 52, 54 and 56 extending into the inner, middle and outer arcuate grooves 32, 34 and 36 would prevent horizontal displacement of the overmolded gasket seal 14 across and along the electronic sign module housing 12.

Even more overmolding is provided by a chemical bond 60 formed between the truncated conical projection 42a-42nn and the truncated conical cavities 40a-40nn. Geometrically-based frictional engagement or attachment is also provided, as previously described, whereby the truncated conical projections 42a-42nn extend from the overmold gasket seal 14 in order to provide a geometric frictional engagement with the truncated conical cavities 40a-40n for an anchored engagement of the overmolded gasket seal 14 to the electronic sign module housing 12. The conical engagement thereof provides an additional attachment to that provided by the chemical bond 60.

The specified temperature range for suitable use exposure and of the thermoplastic elastomer of the overmolded gasket seal 14 in combination with the electronic sign module housing 12 forming an electronic sign module housing having an overmolded gasket seal 10 is 120° F. to −20° F., thereby allowing use over a broad temperature range.

Figure 6:
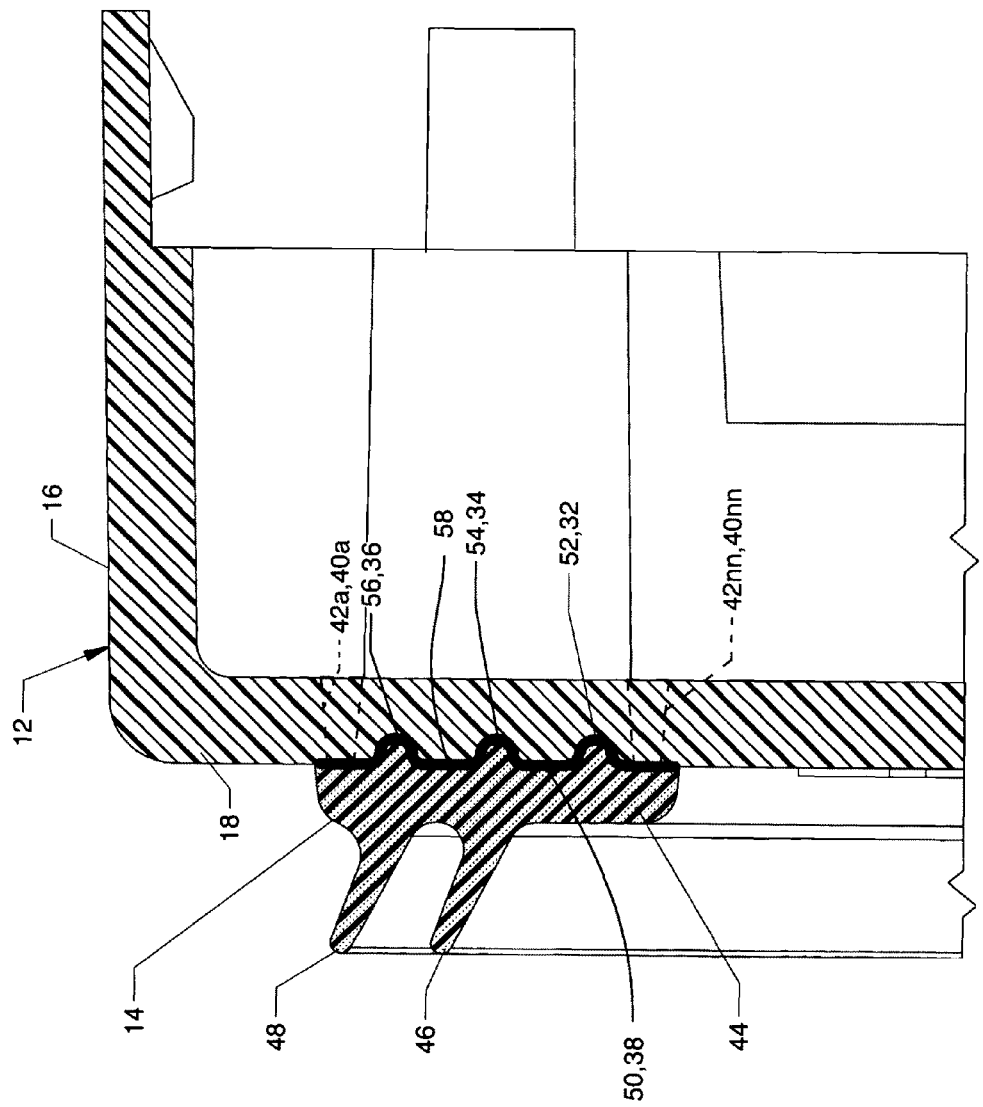
FIG. 6 is a cross section view along line 6-6 of FIG. 1.

FIG. 6 is a cross section view along line 6-6 of FIG. 1. With respect to the overmolded gasket seal 14, the cross section extends through the base 44, through the inner lip 46 and outer lip 48, through the planar surface 50, and through the inner, middle and outer elongated arcuate projections 52, 54 and 56. With respect to the electronic sign module housing 12, the cross section extends through the peripheral wall 16, the panel 18, and the inner, middle and outer arcuate grooves 32, 34 and 36.

Figure 7:
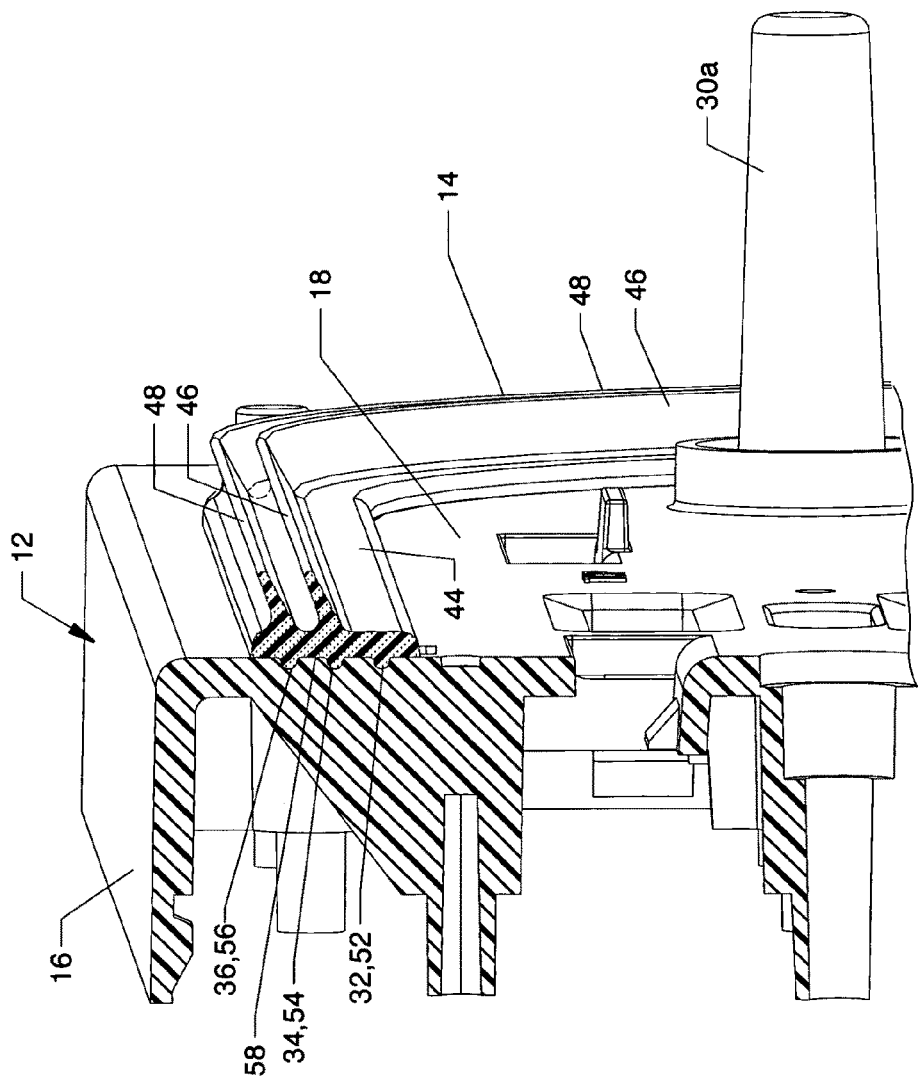
FIG. 7 is a cross section view along line 7-7 of FIG. 1.

FIG. 7 is a cross section view along line 7-7 of FIG. 1 showing the relationship of the overmold gasket seal 14 to the electronic sign module housing 12.

Mode of Operation

Figure 8:
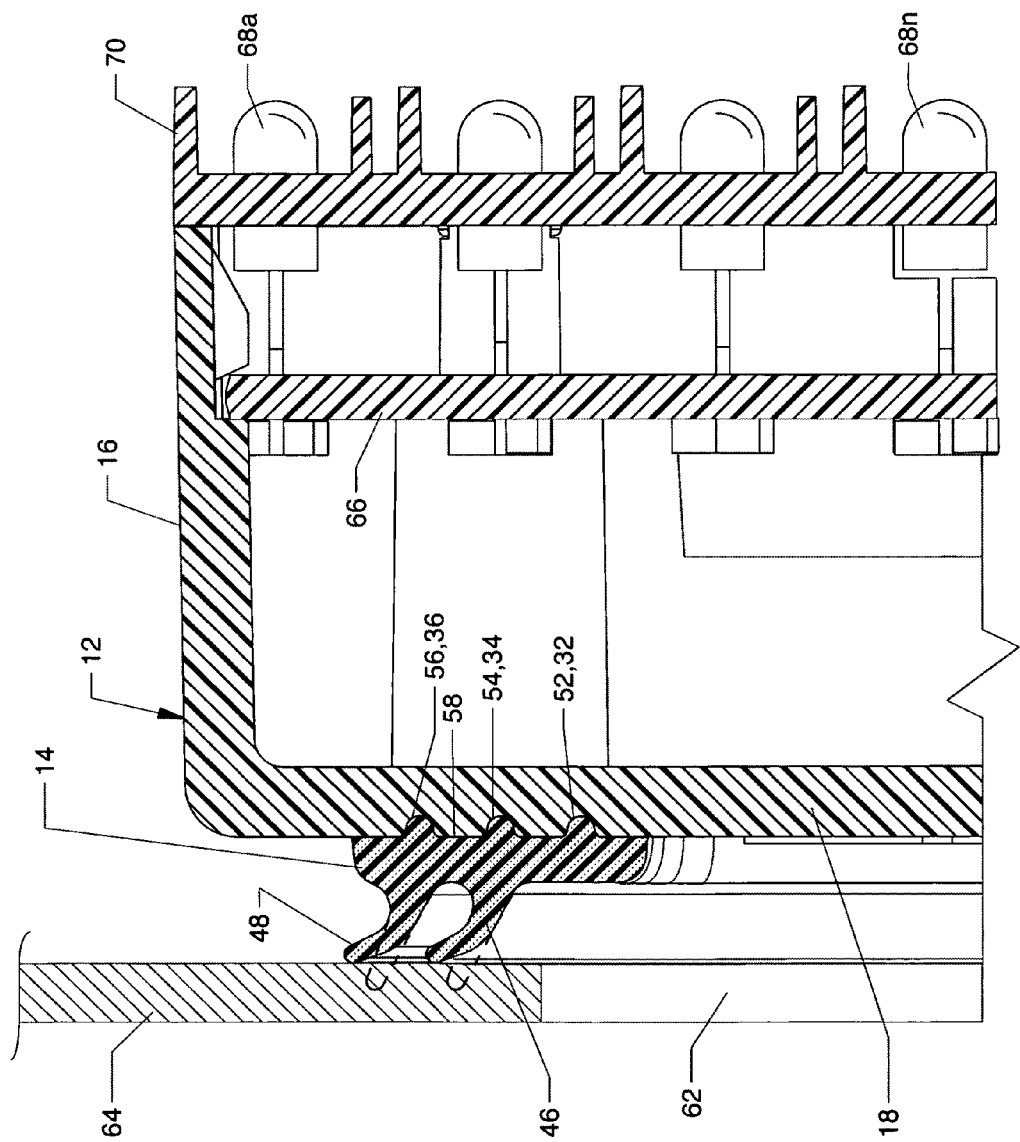
FIG. 8 is cross section view showing the use of the present invention in an intimate flexed sealing engagement about an opening of a mounting panel of an electronic sign showing the mode of operation of the present invention.

FIG. 8 is a cross section view showing the use of the present invention in an intimate, flexed, sealing engagement about an opening 62 of a mounting panel 64 of an electronic sign. More specifically, the electronic sign module housing 12 is positioned in close proximity and secured to the mounting panel 64, such as described in the referenced U.S. Pat. No. 7,055,271, in order to cause a flexed engagement of the inner lip 46 and the outer lip 48 with the mounting panel 64 and to provide a seal about the opening 62. The unflexed position of the inner lip 46 and the outer lip 48 is shown in dashed lines. Also shown as parts of an electronic sign are an LED display panel 66 having a plurality of LEDs 68a-68n attached thereto and a louver panel 70.

Electronic Sign Module Housing Having an Overmolded Gasket Seal

| PARTS LIST | |
| --- | --- |
| 10 | electronic sign module housing having an overmolded gasket seal |
| 12 | electronic sign module housing |
| 14 | overmolded gasket seal |
| 16 | peripheral wall |
| 18 | panel |
| 20 | dashed line |
| 22 | dashed line |
| 24 | louver panel |
| 26a-d | latch mechanisms |
| 28a-d | actuator arms |
| 30a-d | located posts |
| 32 | inner arcuate groove |
| 34 | middle arcuate groove |
| 36 | outer arcuate groove |
| 38 | contact surface |
| 40a-nn | truncated conical cavities |
| 42a-nn | truncated conical projections |
| 44 | base |
| 46 | inner lip |
| 48 | outer lip |
| 50 | planar surface |
| 52 | inner arcuate projection |
| 54 | middle arcuate projection |
| 56 | outer arcuate projection |
| 58 | chemical bond |
| 60 | chemical bond |
| 62 | opening |
| 64 | mounting panel |
| 66 | LED panel |
| 68a-n | LEDs |
| 70 | louver panel |

Various modifications can be made to the present invention without departing from the apparent scope thereof.

It is claimed:

1. An electronic sign module housing comprising:
a plastic enclosure with an overmolded gasket seal, said plastic enclosure having a surrounding side wall;
a rear wall at one end of said surrounding side wall;
a front opening at an opposite end of said surrounding side wall for attachment of a display panel;
said rear wall having a front surface and a rear surface; and,
said overmolded gasket seal being attached and sealed to said rear surface of said rear wall of said plastic enclosure;
wherein said overmolded gasket seal has an inner surface and an outer surface, and wherein said inner surface has a plurality of spaced truncated conical projections extending therefrom, and wherein said rear surface of said rear wall has a plurality of spaced truncated conical cavities that receive said spaced truncated conical projections during an overmolding process such that the truncated conical projections are located within the truncated conical cavities.

2. The electronic sign module housing of claim 1, wherein said overmolded gasket seal is made from a flexible compliant material.

3. The electronic sign module housing of claim 2, wherein said flexible compliant material is a thermoplastic elastomer.

4. The electronic sign module housing of claim 2 wherein, said overmolded gasket seal has a continuous, elongated, non-ending, closed configuration with a central opening therein.

5. The electronic sign module housing of claim 4, wherein said overmolded gasket seal has an inner surface and an outer surface and a plurality of continuously spaced and concentrically arranged elongated projections extending from said inner surface thereof.

6. The electronic sign module housing of claim 5, wherein said rear surface of said rear wall of said plastic enclosure has a plurality of continuously spaced and concentrically arranged elongated grooves for reception of said spaced elongated projections.

7. The electronic sign module housing of claim 6, wherein there are three spaced elongated projections and three spaced elongated grooves.

8. The electronic sign module housing of claim 4 wherein, said overmolded gasket seal has an inner surface and an outer surface and plurality of continuously spaced and concentrically arranged elongated arcuate projections extending from said inner surface thereof.

9. The electronic sign module housing of claim 8, wherein said rear surface of said rear wall has a plurality of continuously and concentrically arranged elongated arcuate grooves for reception of said spaced elongated arcuate projections.

10. The electronic sign module housing of claim 9 wherein, there are three spaced arcuate projections and three spaced arcuate grooves.

11. An electronic sign module housing comprising:
a plastic enclosure with an overmolded gasket seal, said plastic enclosure having a surrounding side wall;
a rear wall at one end of said surrounding side wall;
a front opening at an opposite end of said surrounding side wall for attachment of a display panel;
said rear wall having a front surface and a rear surface; and,
said overmolded gasket seal being attached and sealed to said rear surface of said rear wall of said plastic enclosure;
wherein said overmolded gasket seal has a continuous, elongated, non-ending, closed configuration with a central opening therein;
wherein said overmolded gasket seal is made from a flexible compliant material;
wherein said overmolded gasket seal has a continuous, elongated, non-ending, closed configuration with a central opening therein;
wherein said overmolded gasket seal has an inner surface and an outer surface and plurality of continuously spaced and concentrically arranged elongated arcuate projections extending from said inner surface thereof;
wherein said rear surface of said rear wall has a plurality of continuously and concentrically arranged elongated arcuate grooves for reception of said spaced elongated arcuate projections, wherein there are three spaced arcuate projections and three spaced arcuate grooves; and wherein said inner surface has a plurality of spaced truncated conical projections extending therefrom and located above and below said plurality of spaced arcuate projections, and wherein said rear surface of said rear wall includes a plurality of spaced truncated conical cavities to receive said spaced truncated conical projections during an overmolding process such that the truncated conical projections are located within the truncated conical cavities.

12. The electronic sign module housing of claim 11, wherein said overmolded gasket seal has an outer surface with a plurality of spaced flexible outer lips extending upwardly at an angle therefrom.

13. The electronic sign module housing of claim 12, wherein there are two spaced flexible outer lips.

14. The electronic sign module housing of claim 11, wherein said overmolded gasket seal is made from a thermoplastic elastomer.

15. An electronic sign module housing comprising:
a plastic enclosure with an overmolded gasket seal, said plastic enclosure having a surrounding side wall;
a rear wall at one end of said surrounding side wall;
a front opening at an opposite end of said surrounding side wall for attachment of a display panel;
said rear wall having a front surface and a rear surface; and,
said overmolded gasket seal being attached and sealed to said rear surface of said rear wall of said plastic enclosure;
wherein said overmolded gasket seal is made from a flexible compliant material;
wherein said overmolded gasket seal has a continuous, elongated, non-ending, closed configuration with a central opening therein;
wherein said overmolded gasket seal has an inner surface and an outer surface and a plurality of continuously spaced and concentrically arranged elongated projections extending from said inner surface thereof;
wherein said rear surface of said rear wall of said plastic enclosure has a plurality of continuously spaced and concentrically arranged elongated grooves for reception of said spaced elongated projections; and wherein said inner surface has a plurality of spaced truncated conical projections extending therefrom and located above and below said plurality of spaced projections, and wherein said rear surface of said rear wall includes a plurality of spaced truncated conical cavities to receive said spaced truncated conical projections during an overmolding process such that the truncated conical projections are located within the truncated conical cavities.

16. The electronic sign module housing of claim 15, wherein, said overmolded gasket seal has an outer surface with a plurality of spaced flexible outer lips extending upwardly at an angle therefrom.

17. The electronic sign module housing of claim 16, wherein there are two spaced flexible outer lips.

18. The electronic sign module housing of claim 15, wherein said plastic enclosure has a generally rectangular configuration.

19. The electronic sign module housing of claim 18, wherein said overmolded gasket seal has a substantially rectangular configuration with arcuate corners.

20. The electronic sign module housing of claim 15, wherein said overmolded gasket seal is made from a thermoplastic elastomer.

21. The electronic sign module housing of claim 15, wherein said overmolded gasket seal is made from a thermoplastic elastomer.

22. The electronic sign module housing of claim 15, wherein said plastic enclosure has a generally rectangular configuration.

23. The electronic sign module housing of claim 22, wherein said overmolded gasket seal has a substantially rectangular configuration with arcuate corners.

24. The electronic sign module housing of claim 15, wherein said display panel includes a louver panel and a plurality of light sources attached thereto.

25. The electronic sign module housing of claim 24, wherein said light sources are LEDs.

26. The electronic sign module housing of claim 15, wherein said plastic enclosure is made from a hard and rigid plastic material.

* * * * *